(12) United States Patent
Iyer

(10) Patent No.: US 6,992,888 B1
(45) Date of Patent: Jan. 31, 2006

(54) PARALLEL COOLING OF HEAT SOURCE MOUNTED ON A HEAT SINK BY MEANS OF LIQUID COOLANT

(75) Inventor: Hari Iyer, Mercerville, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 1 day.

(21) Appl. No.: 10/795,753

(22) Filed: Mar. 8, 2004

(51) Int. Cl.
*H05K 7/20* (2006.01)

(52) U.S. Cl. ............... 361/699; 361/704; 361/711; 257/714; 165/80.4

(58) Field of Classification Search ........ 361/688–690, 361/698, 699, 704, 707–711; 257/714; 174/15.1; 165/80.4, 185
See application file for complete search history.

(56) References Cited

U.S. PATENT DOCUMENTS

| | | | | |
|---|---|---|---|---|
| 4,762,174 A | * | 8/1988 | Artus | 165/185 |
| 4,764,845 A | * | 8/1988 | Artus | 361/705 |
| 5,270,572 A | * | 12/1993 | Nakajima et al. | 257/714 |
| 5,305,184 A | * | 4/1994 | Andresen et al. | 361/699 |
| 5,373,417 A | * | 12/1994 | Barrett | 361/699 |
| 5,459,474 A | | 10/1995 | Mattioli et al. | 343/702 |
| 6,175,501 B1 | * | 1/2001 | Bortolini et al. | 361/720 |
| 6,388,317 B1 | | 5/2002 | Reese | 257/713 |
| 6,465,730 B1 | | 10/2002 | Pluymers et al. | 174/28 |
| 6,695,974 B2 | * | 2/2004 | Withers et al. | 252/70 |
| 6,819,561 B2 | * | 11/2004 | Hartzell et al. | 361/689 |

* cited by examiner

*Primary Examiner*—Boris Chérvinsky
(74) *Attorney, Agent, or Firm*—Duane Morris LLP

(57) ABSTRACT

A module includes a cold plate. Solid-state heat sources are thermally mounted on the cold plate in a chamber defined by the cold plate and a lid. Cooling of the heat sources is enhanced by a dielectric liquid within the chamber. The liquid has a boiling point slightly below the temperatures of "hot" spots, to form small bubbles during operation, which enhance convection flow. The liquid may be a mixture of fluorocarbons of different boiling points. The liquid may contain diamond particles.

6 Claims, 8 Drawing Sheets

PARALLEL COOLING OF HEAT SOURCE MOUNTED ON A HEAT SINK BY MEANS OF LIQUID COOLANT

FIELD OF THE INVENTION

This invention relates to the cooling of solid-state devices, and more particularly to the transfer of heat by way of a thermally conductive liquid with a controlled boiling point.

BACKGROUND OF THE INVENTION

The use of solid-state modules is widespread in the fields of electronic and photonic communication, television and radio, radar, and other surveillance and signal processing contexts. In some contexts, notably surveillance and signal processing, it is important to maximize the performance of the various solid-state devices.

Solid-state devices are made in a variety of ways. Photolithography is often used to mask one or more portions of the surface of a semiconductor wafer. Dopant materials are introduced into the atmosphere surrounding the wafer, and the temperatures are adjusted to cause the dopants to diffuse into the surface of the wafer, to thereby affect the conductivity in portions of the wafer. This process is repeated with various dopant materials and other materials, so as to generate many devices on the surface of the semiconductor wafer. When complete, the wafer is broken or sawed into sections having the desired number of semiconductor devices in each section. In this manner, devices including hundreds, thousands, or tens of thousands of active devices can be fabricated in a structure less than a centimeter on a side. The ability to fabricate hundreds or thousands of such devices by processing a single semiconductor wafer allows very low unit cost, which has driven the microelectronics boom.

It is well known that transistors are adversely affected by high temperatures. In this context, thermally induced dopant migration in the solid-state wafer material is a major contributor to failure of solid-state devices. It is important, therefore, to maintain the temperatures of solid-state devices below some value, which is deemed to provide the desired operational lifetime. Thus, it may be desirable to keep a silicon solid-state device at a temperature of less than 150° Celsius (C.), even though it may operate (albeit for a shorter period of time) at 200° C. Generally, similar temperature criteria apply to Gallium Arsenide MMIC devices used in radar applications.

The operating frequencies of solid-state devices for the above mentioned applications keep rising, as more functionality is demanded. As for example, the operating clock frequencies of computers continue to increase in order to provide faster processing. Also, the power handled by solid-state devices tends to increase, as improved performance is required. For example, Monolithic Microwave Integrated Circuit (MMIC) devices for use in array antennas for radar surveillance are required to produce ever-increasing amounts of transmitter power. High power and high operating frequency are closely related to temperature in a solid-state device. In many cases, achieving the desired power level requires the combining or arraying of a plurality of solid-state devices or modules. The close spacing of solid-state devices in these contexts, in turn, tends to increase the power density within the combination or array, which exacerbates the problem of maintaing temperature. The cooling of solid-state devices has become a major consideration in the design of electronic and photonic systems.

The prior art includes various patents describing various approaches to the cooling of modules. Such an arrangement is described in U.S. Pat. No. 5,459,474, issued Oct. 17, 1995 in the name of Mattioli et al. The Mattioli et al. arrangement includes an array of horn-like elemental antennas fabricated in a conductive plate, with little room to the rear of the antennas for electronic devices. The Mattioli et al. arrangement includes a slide-in carrier bearing the electronic modules, which carrier mates with the elemental antennas. In the Mattioli et al arrangement, the modules are mounted on carriers, which are fastened to cold plates cooled by circulation of coolant liquid. U.S. Pat. No. 6,465,730, issued Oct. 15, 2002 in the name of Pluymers et al. describes a method for mating electronic modules in a high-density context, to provide heat transfer to a cold plate.

Attention has been directed in the prior art toward moving the cold plate closer to the actual source of the heat. U.S. Pat. No. 6,388,317, issued May 14, 2002 in the name of Reese, describes a module in which the solid-state device to be cooled is mounted on a thermally conductive carrier, and the carrier contains microchannels through which coolant liquid is circulated.

Improved or alternative cooling arrangements are desired for solid-state devices.

SUMMARY OF THE INVENTION

A structure, according to an aspect of the invention, comprises a cold plate and a solid-state source of heat affixed to a surface portion of the cold plate, which may be a planar surface portion, for transferring at least some of the heat by direct thermal conduction from the source of heat to the cold plate. The source of heat has a temperature distribution, when operating, defining at least one particular spot maximum temperature. The structure also includes an enclosing structure or lid defining a closed space encompassing the source of heat and at least a surface portion of the cold plate other than the portion to which the source of heat is affixed. A dielectric liquid substantially fills the closed space, where it is in contact with both the source of heat and with that surface portion of the cold plate other than the portion to which the source of heat is affixed. The dielectric liquid has a boiling point slightly below or lower than the temperature of the spot maximum temperature. The dielectric liquid contains diamond particles, which may be in the form of diamond dust. In one embodiment of the invention, the dielectric liquid comprises a mixture of fluorocarbons, each having a different boiling point.

In one advantageous embodiment, the solid-state heat source comprises semiconductor devices exposed to the dielectric liquid, and the mixture of fluorocarbons is inert.

In another advantageous embodiment, the cold plate comprises at least one closed channel extending there through for the flow of coolant fluid other than the dielectric fluid.

BRIEF DESCRIPTION OF THE DRAWING

FIG. 1b is a simplified perspective or isometric view of the underside of the cold plate of FIG. 1a.

FIG. 3f is a simplified cross-sectional representation of the arrangement of FIG. 3a.

DESCRIPTION OF THE INVENTION

Figure 1A:
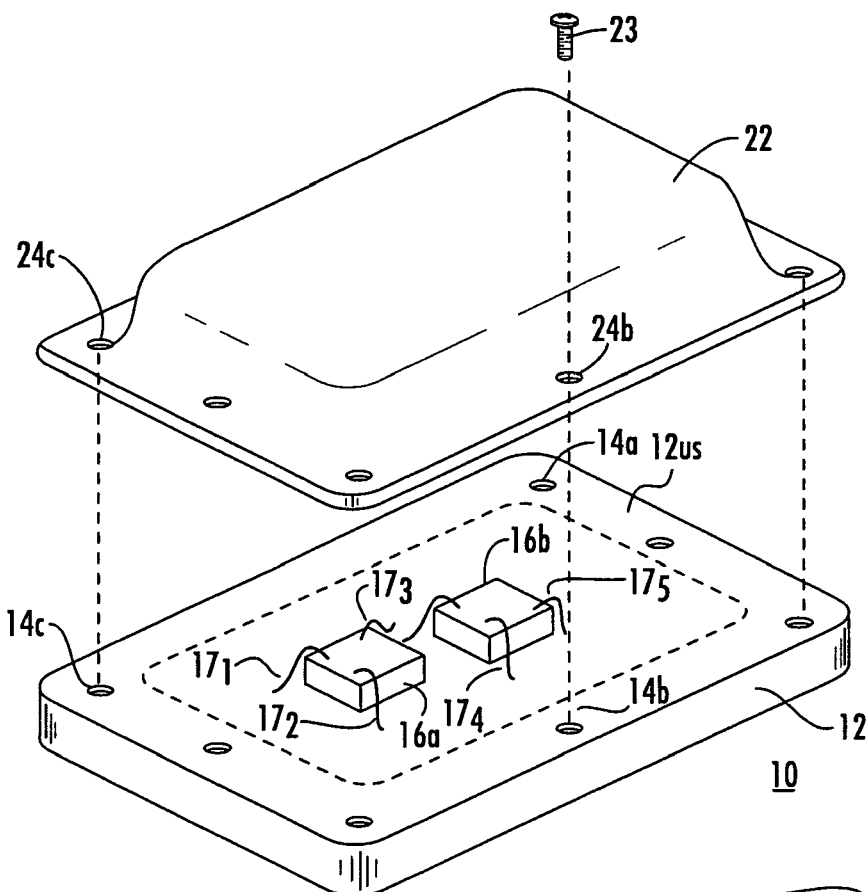
FIG. 1a is a simplified perspective or isometric view, partially exploded to reveal interior details of a module including a lid, solid state devices, and a cold plate arranged for cooling by a flow of coolant fluid as described generally in the prior art.
Figure 1B:
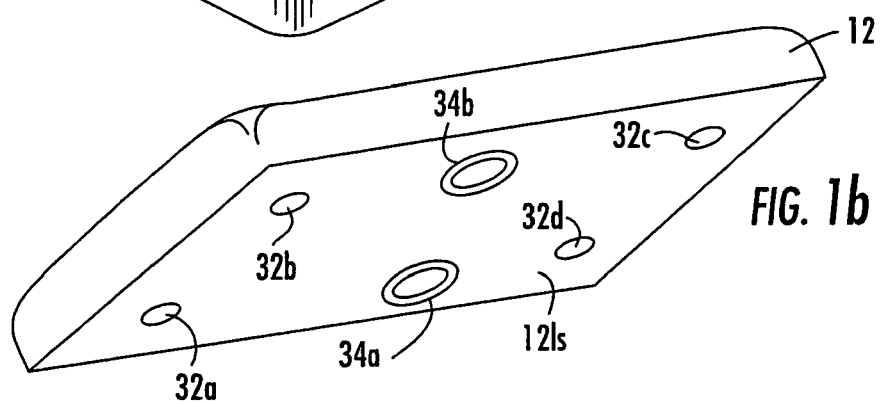
Figure 1C:
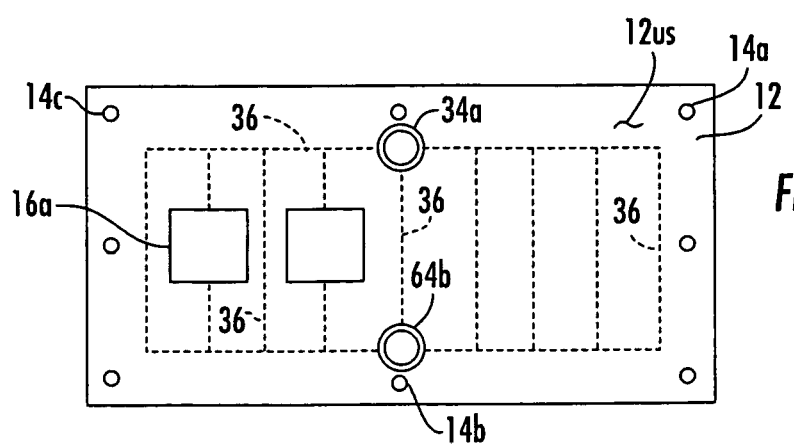
FIG. 1c is a plan view of the upper surface of the cold plate showing the locations of coolant channels extending through the cold plate and also showing locations of some of the solid-state devices mounted thereon.

In FIGS. 1a, 1b, and 1c a module 10 includes a mounting plate or cold plate 12 defining an upper broad surface 12us, a lower board surface 12ls, and a plurality 14 of threaded lid screw mounting holes, some of which are designated 14a, 14b, and 14c. These screw mounting holes do not extend all the way through the cold plate 12. As illustrated in FIG. 1a, solid-state devices represented as blocks 16a and 16b are mounted on or affixed to the upper surface 12us of cold plate 12. These solid-state devices are the major sources of heat in the module 10.

Solid-state devices 16a and 16b of FIG. 1a have electrical bond wires, some of which are designated $17_1$, $17_2$, $17_3$, $17_4$, and $17_5$ making electrical interconnections to electrically conductive traces (not illustrated) lying on or adjacent to the upper surface 12us of the cold plate. As illustrated a lid or cover 22 is dimensioned to fit over a portion of the upper surface 12us of cold plate 12. The lid 22 is affixed to cold plate 12 by screws, one of which is illustrated as 23, which extend through clearance apertures, some of which are designated 24b and 24c, and are threaded into corresponding threaded apertures such as 14a, 14b, and 14c in the cold plate 12.

Electrical power for energizing the solid-state devices 16a and 16b of FIG. 1a enters the module 10 through one or more electrical connectors or ports 32a, 32b, 32c, or 32d, visible on the underside or undersurface 12ls of module 12 in FIG. 1b. One or more of these electrical ports 32a, 32b, 32c, or 32d may be used for providing signals to be processed to the module 12, and one or more of the electrical ports may be used to carry the processed signal away from the module, as known in the art.

It should be emphasized that the "cold" plate 12 is cold only by comparison with the sources of heat 16a, 16b, and may indeed be hot to the touch.

As illustrated in FIG. 1b, the underside or undersurface 12ls of module 12 also includes or defines coolant fluid input and output ports 34a and 34b, each of which may be associated with an O-ring or O-ring groove for providing for a tight seal to a source or sink of coolant fluid (not illustrated), as known in the art.

In the plan view of FIG. 1c, which shows the upper surface 12us of cold plate 12 of module 10, possible internal paths for the flow of coolant fluid between fluid ports 34a and 34b are illustrated as dash lines 36. As illustrated, some of the coolant fluid paths 36 extending through cold plate 12 pass directly underneath the solid-state heat sources 16a and 16b, to thereby reduce the thermal path lengths through which heat must flow to reach the coolant fluid within the fluid channels 36. Reduction of thermal path lengths tends to minimize the temperature rise required to achieve a given heat flow.

Figure 2:
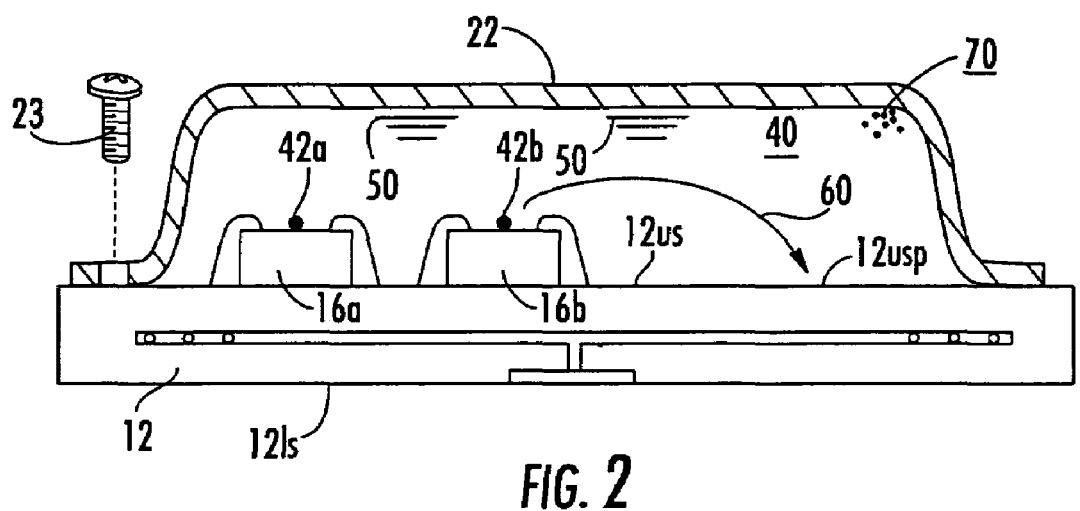
FIG. 2 is a cross-sectional side elevation view of the structure of FIG. 1a showing the location of the lid, the surface of the cold plate to which the solid-state devices are affixed, and other surfaces of the cold plate and the cavity or chamber defined between the lid and the cold plate which is filled with a liquid having certain temperature and heat characteristics.

FIG. 2 is a simplified cross-sectional side elevation view of the structure of FIGS. 1a, 1b, and 1c in the assembled state. In FIG. 2, lid 22 is affixed to the upper surface 12us of cold plate 12. As illustrated, the combination of the lid 22 extending over a portion of the upper surface 12us of cold plate 12 results in a cavity or enclosed space designated generally as 40.

When the solid-state devices 16a and 16b of FIGS. 1a, 1c and 2 are energized, their temperatures will rise, even though they are connected to a cold plate. This is, in part, because the flow of heat necessarily requires a temperature differential across the thermal resistance or impedance of the thermal path. In the case MMICs, the heat generation may be concentrated at or near the upper surfaces of the solid-state devices, namely at locations such as 42a or 42b of FIG. 2. Consequently, the heat flow path from the actual source of heat generation includes a portion of the solid-state device itself. The heat flow path also includes a junction or thermal connection between the solid-state device and the upper surface 12us of the cold plate 12.

According to an aspect of the invention, a dielectric liquid, designated generally as 50, completely fills or substantially completely fills the cavity 40 defined between the interior of lid 22 and the solid-state devices 16a, 16b and those portions of the upper surface 12us of cold plate 12 to which the solid-state devices 16a, 16b are not affixed. This dielectric liquid has some thermal conductivity, and provides additional path(s) for the flow of heat from the high-temperature or "hot" spots 42a, 42b to the cold plate. The additional path(s) are represented in FIG. 2 by the arrow 60, extending from the high-temperature spot 42b to a portion 12usp of the upper surface 12us of cold plate 12 which is not covered by the affixation of solid-state devices 16a, and 16b.

The additional thermal paths for conduction of heat from the hot spots 42a, 42b of the solid-state devices 16a, 16b are effectively in parallel with the direct conduction thermal paths extending from the hot spots 42a, 42b, through the bodies of their solid-state devices 16a, 16b, respectively, and to the upper surface 12us of cold plate 12. Since the additional thermal conduction paths provided by the dielectric liquid are in parallel with the direct conduction thermal paths, they carry heat substantially independently of the direct conduction path and provide for flow of the heat generated by the solid-state device to the cold plate with a lower temperature rise. Thus, the introduction of a dielectric liquid into the cavity 40 itself lowers the operating temperature of the solid-state device.

According to another aspect of the invention, the dielectric liquid 50 introduced into, or contained within the cavity 40 of FIG. 2, is a liquid which is inert as to the solid-state device, so that the improvement in reliability occasioned by lowering the operating temperature (or equivalently the higher operating power allowed at the same operating temperature) is not compromised by corrosion or other adverse effects attributable to the liquid. Among the liquids known to be substantially inert are fluorocarbon liquids.

According to another aspect of the invention, the boiling point of the dielectric liquid 50 introduced into or contained within the cavity 40 is selected to be just under, or slightly less than, the operating temperature of the "hot" spots of the solid-state devices. In one embodiment, this effect is achieved by mixing together fluorocarbon liquids having known boiling temperatures in order to make a mixed liquid having the desired boiling point.

From a catalogue of 3M Company, fluorocarbon liquids, which are miscible and have known different boiling points, are types

| 3M Fluorinert electronic liquids: | | | | | | | |
|---|---|---|---|---|---|---|---|
| 3M # | FC87 | FC72 | FC84 | FC77 | FC40 | FC43 | FC70 |
| Boiling point ° C. | 30 | 56 | 80 | 97 | 155 | 174 | 215 |

These fluids are manufactured by
   3M Electronic markets materials div
   3M Center Bldg 223-6s-04, St Paul, Minn. 55144

Other 3M Novec HFE fluids are available with boiling points ranging from 215° to 250°.

The mixing of the fluorocarbons is performed by proportioning the amounts of two or more of the liquids. Mixing 50% by weight of FC77 fluorocarbon, having a boiling point of 97° C., with FC 43 having a boiling point of 174° C., will provide a liquid with a boiling point of about 135° C.

The adjustment of the boiling point of the thermally conductive liquid occupying the cavity 40 of FIG. 2 has the advantage that some bubble formation occurs during operation, which "stirs" the liquid, and tends to provide some convection movement of the liquid from the hot spots 42a, 42b toward those surfaces 12us of the cold plate 12 which are exposed to the liquid. This convection movement adds to the movement of heat provided by the dielectric liquid. The dielectric liquid, in this aspect of the invention, uses small-bubble formation to enhance convection to improve heat transfer over that provided by thermal conduction of the liquid taken alone. If the boiling point of the liquid 50 is much lower than the temperature of the hot spots 42a, 42b, large bubbles tend to be formed. While these large bubbles provide good stirring, the bubbles themselves, when "at" the hot spots 42a, 42b, tend to surround the hot spots with gaseous matter, which is not a good conductor of heat. Thus, while formation of small bubbles tends to improve the heat flow attributable to the dielectric liquid, the formation of large bubbles degrades the heat transfer performance. Relative temperatures also depend, in part, on the surface area of the hot spot and cold plate surface area exposed to the fluorocarbon (FC) liquid. It also depends on the surface finish of the hot spot. For example, with the cold plate maintained at 125° C. and with hot spot power of about 160 watts per square inch, 150° C. desired hot spot temperature can be achieved using 135° C. boiling point FC liquid, when without the FC liquid the hot spot temperature will be over 200° C.

According to a further aspect of the invention, the thermal conductivity of the dielectric liquid occupying the cavity 40 of FIG. 2 is enhanced by inclusion therein of diamond particles. The diamond particles are illustrated as 70 of FIG. 2. When the unit is turned on, the movement of the fluid inside the module carries the diamond dust about. Some of the diamond dust temporarily adheres to the hot spot and gives it a "rough" surface. This helps in bubble formation since rough surfaces help bubble formation more than smooth surfaces. Finer size diamond dust is carried more efficiently by the FC fluid and provides better heat dispersion. The thermal conductivity of natural diamond dust is in the range of 1800 to 3200 W/m° K. (For comparison, thermal conductivity of aluminum alloys are in the range of 150 to 220 W/m° K).

Figure 3A:
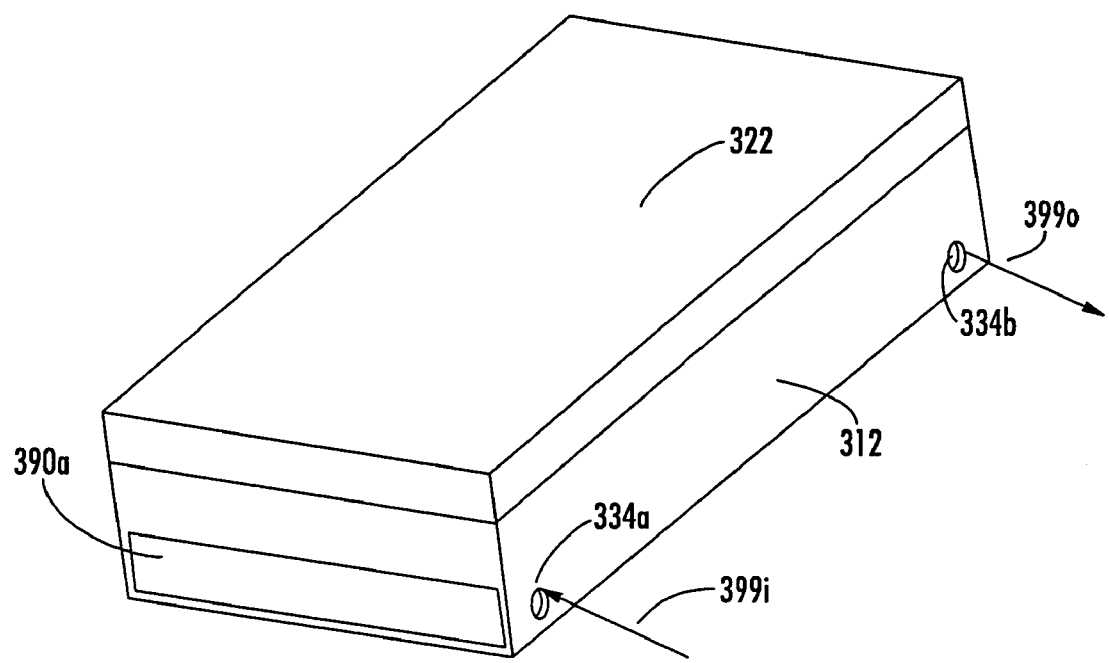
FIG. 3a is a simplified overall perspective or isometric view of a module in which the invention may be used.

FIG. 3a illustrates in overall view, a module 300 in which the invention may be used. In FIG. 3a, the cold plate is designated 312, a coolant fluid input port is designated 334a, and a coolant fluid output port is designated 334b. The direction of coolant fluid input and output flow is identified by arrows 399i and 399o, respectively. Item 322 is a cover corresponding to cover 22 of FIG. 1a. A cover for a coolant liquid portion of cold plate 312 is designated 390a.

Figure 3B:
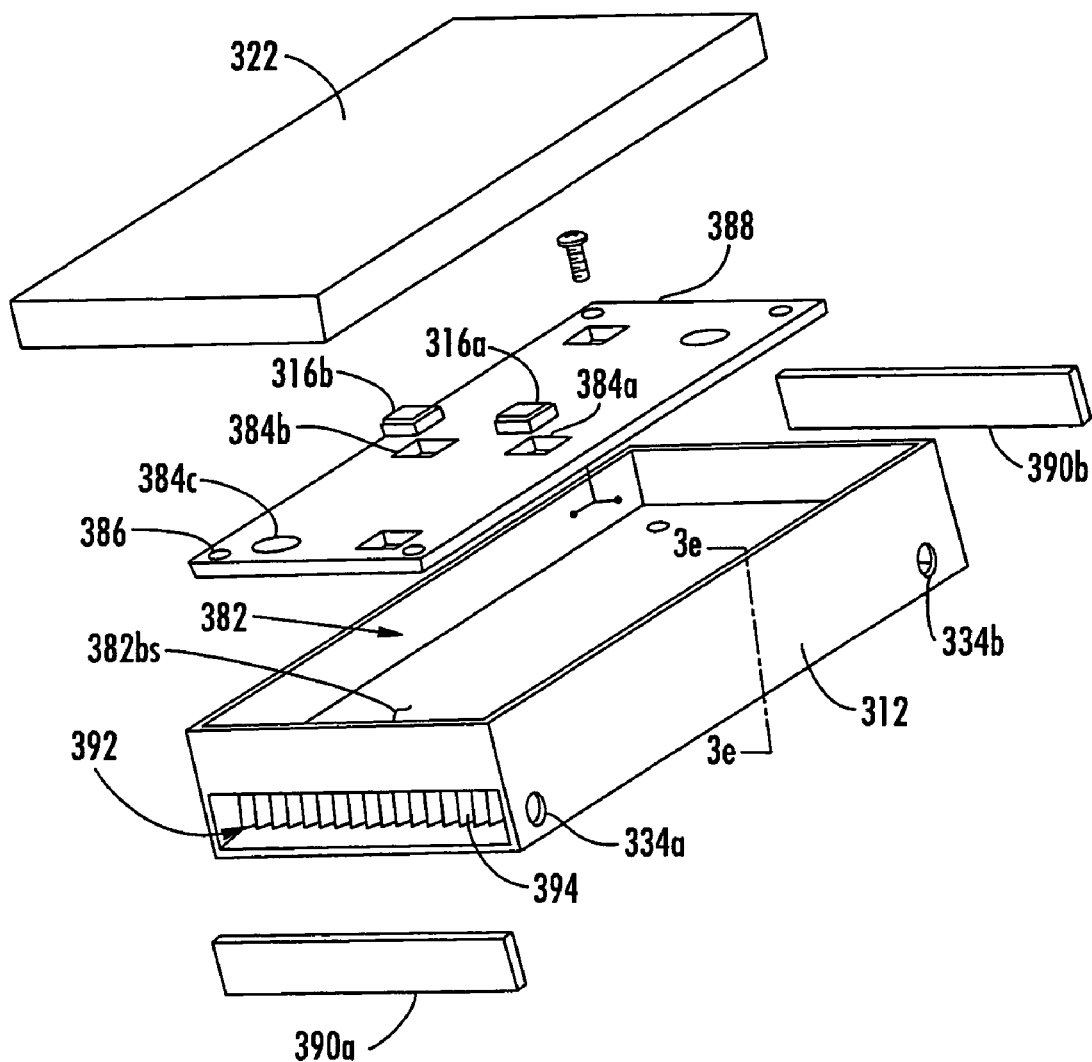
FIG. 3b is an exploded view thereof.

In FIG. 3b, cover 390a and a corresponding cover 390b are illustrated exploded away from cold plate 312, to reveal a chamber 392 for containing the liquid coolant for the cold plate. Chamber 392 contains a plurality of fins, one of which is designated 394, for aiding in transfer of heat from cold plate 312 to the flow of coolant from input port 334a, through chamber 392, and out of port 334b. Chamber 392 is sealed by covers 390a and 390b, so the only access is by way of the fluid input and output ports 334a, 334b, respectively.

Also in FIG. 3b, a printed-circuit board 388 defines mounting screw clearance apertures, one of which is designated 386, and also defines at least one aperture 384a, dimensioned to clear a solid-state module or integrated circuit 316a. Instead of being mounted by the use of screws, the thermal resistance between the printed circuit board and the underlying cold plate may be reduced by bonding or soldering the printed circuit board thereto. Printed-circuit board 388 may also define other apertures, one of which is designated 384b, dimensioned to clear other solid-state modules or integrated circuits, such as 316b. Printed-circuit board 388 also defines at least one other aperture, designated 384c, for allowing thermal contact of the fluid with which cavity 382 is filled to the bottom surface 382bs of cavity 382. Printed-circuit board 388 is dimensioned to fit within a cavity 382 defined by walls of the cold plate 312. Cover 322 is dimensioned to cover and hermetically seal cavity 382 to contain thermal transfer dielectric liquid contained in the closed cavity.

Figure 3C:
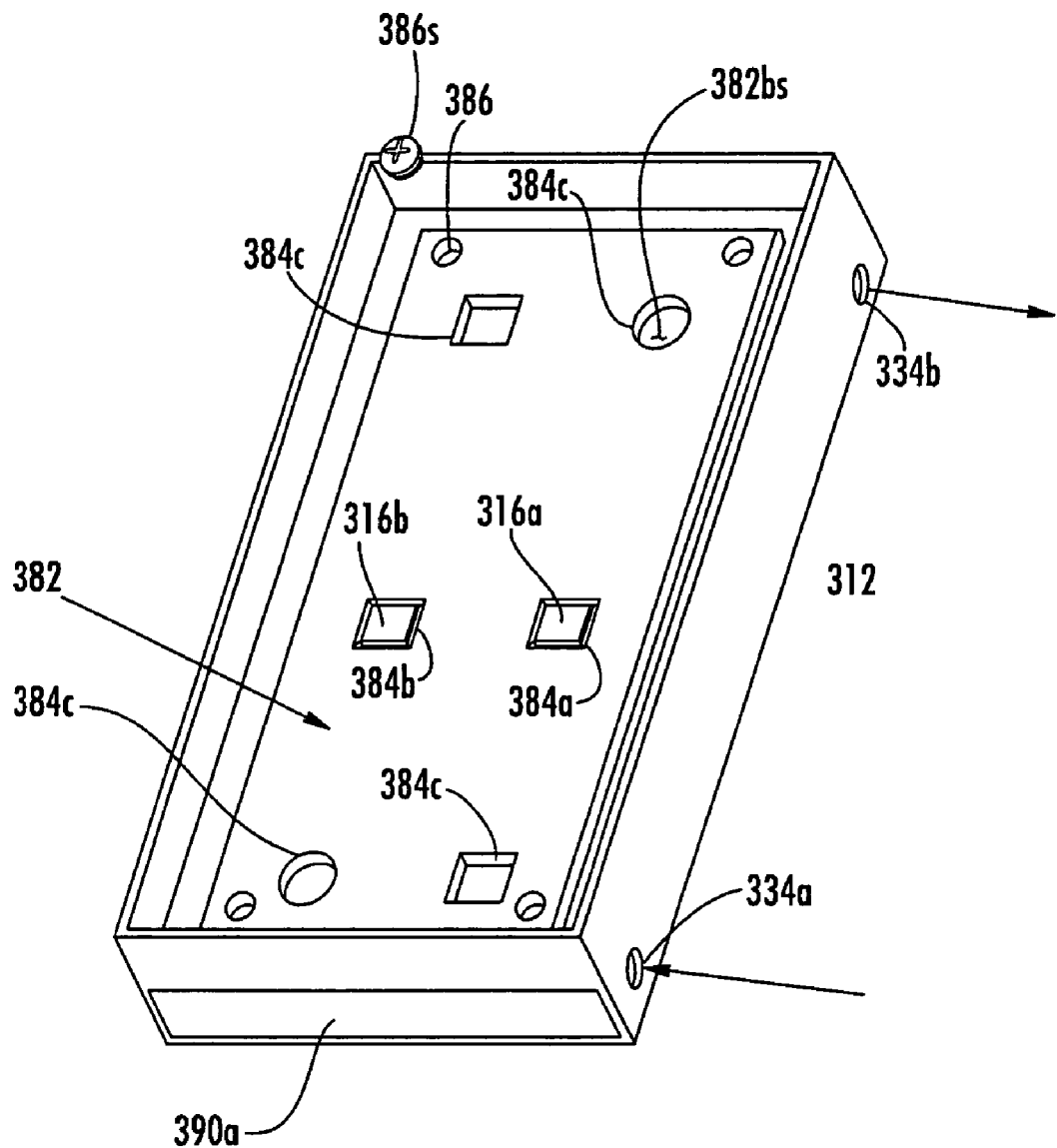
FIG. 3c is a simplified perspective or isometric view of the arrangement of FIG. 3b in a partially assembled form.

In FIG. 3c, the partially assembled structure includes cold plate 312 with its fluid flow input and output ports 334a and 334b, respectively. Cover 390a covers and seals the chamber 392 visible in FIG. 3b. Also in FIG. 3c, the printed-circuit board 388 is mounted against or adjacent the bottom surface 382bs of cavity 382, and fastened in place, by soldering, bonding, or use of screws, one of which is represented as 386S, threaded into the bottom surface 382bs. As illustrated, the solid-state or semiconductor modules or integrated circuits 316a and 316b are mounted through clearance apertures 384a and 384b, respectively, and are mechanically and thermally fastened to the upper surface 382bs of the bottom of cavity 382. The fastening of the solid-state or semiconductor modules or integrated circuits 316a and 316b to the bottom surface 382bs of cavity 382 provides good direct thermal conduction from each of the solid-state or semiconductor modules or integrated circuits 316a and 316b to the flow of coolant fluid contained in chamber 392 (visible in FIG. 3b).

Figure 3D:
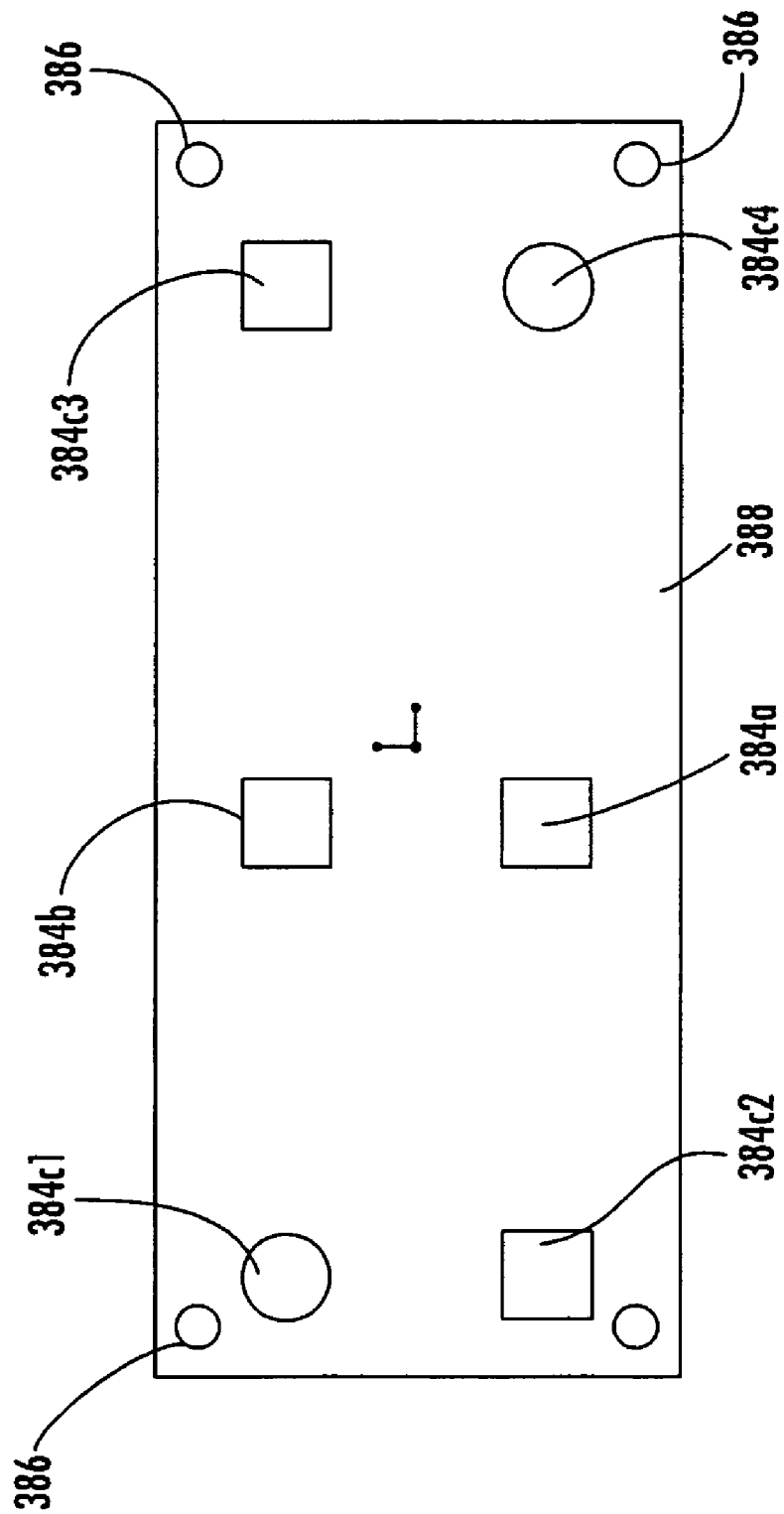
FIG. 3d is a simplified representation of a printed circuit board of the arrangement of FIG. 3b.

FIG. 3d is a simplified plan view representation of printed circuit board 388 of FIG. 3c. Elements of FIG. 3d corresponding to those of FIG. 3b or 3c are designated by like reference alphanumerics, possibly with suffixes. In FIG. 3d, four screw clearance apertures 386 are seen. More or fewer may of course be used, if desired. Naturally, if bonding or soldering is used to hold the printed circuit board in place, screws need not be used. Also, the clearance apertures 384*a* and 384*b* for the two solid-state or semiconductor modules or integrated circuits 316*a* and 316*b* can be seen. More or fewer such clearance apertures may be used, depending upon the number of high heat-producing devices, which are incorporated into module 300. In addition, FIG. 3*d* illustrates the other possible apertures, namely apertures 384*c*1, 384*c*2, 384*c*3, and 384*c*4 as being four in number. These apertures are illustrated as having either a round or square configuration, but may be of any shape, including irregular shapes.

Figure 3E:
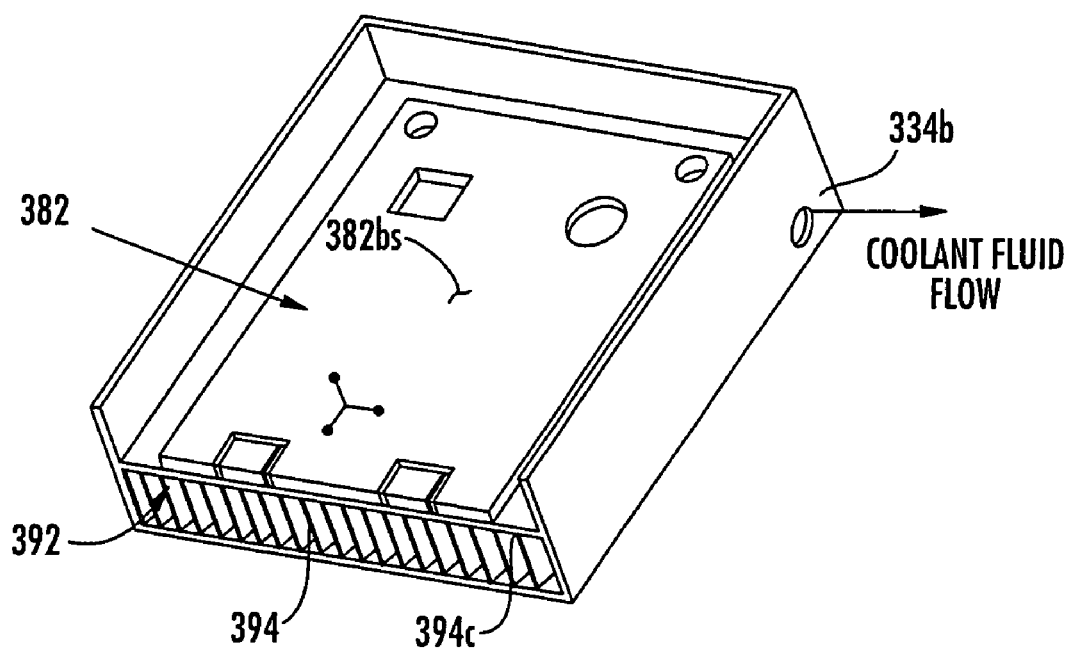
FIG. 3e is a simplified perspective or isometric view, partially cut away to reveal interior details of a cold plate according to an aspect of the invention

FIG. 3*e* is a simplified perspective or isometric view in cross-section, of cold plate 312 of FIGS. 3*b* and 3*c*, illustrating a portion of chamber 392, fins 394, and cavity 382 with its bottom surface 382*bs*.

Figure 3F:
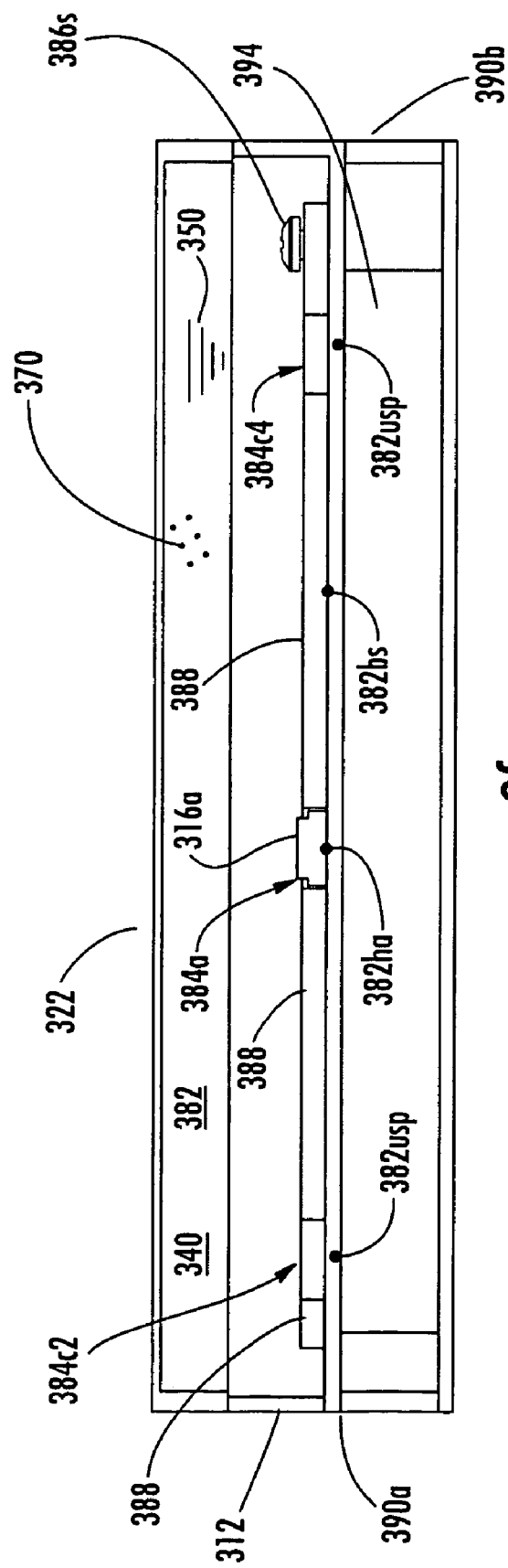

FIG. 3*f* is a cross-sectional view of the arrangement of FIG. 3*b* in its assembled form, with coolant dielectric fluid 350, with its load of diamond dust, filling the chamber 340 defined between cavity 382 and lid 322. The heat source in the form of solid-state device 316*a* is attached to the bottom surface 382*bs* at a location designated 382*ha*, and that location is where the direct heat conduction from the heat source 316*a* to the cold plate 312 is maximum. As illustrated in FIG. 3*f*, apertures 384*c*2 and 384*c*4 are visible, and provide a path by which heat can flow readily from the fluid 350 to surface 382*bs* at locations 382*usp* without being impeded by the thermal resistance of the printed circuit board 388.

Other embodiments of the invention will be apparent to those skilled in the art. For example, printed-circuit boards or other dielectric sheets may be provided within the cavity 40 for bearing electrically conductive traces, which distribute power and signal as needed. While the cold plate has been described as being cooled by flow of coolant fluid through internal channels, the cooling may instead be provided by immersing a surface of the cold plate in a coolant liquid, by physically connecting the cold plate to a further cold plate to provide direct thermal conduction there between, or by the flow of coolant fluid over a surface of the cold plate, as for example by the use of common heat sink fins on the cold plate, with forced or unforced air flow across the fins.

Thus, a structure according to an aspect of the invention comprises a cold plate (12; 312), and a solid-state source of heat (16*a*, 16*b*; 316*a*, 316*b*) affixed to a surface portion of the cold plate (12; 312), which may be a planar surface portion, for transferring at least some of the heat by direct thermal conduction from the source of heat (16*a*, 16*b*; 316*a*, 316*b*) to the cold plate (12; 312). The source of heat (16*a*, 16*b*; 316*a*, 316*b*) has a temperature distribution, when operating, defining at least one particular spot maximum temperature (42*a*, 42*b*). The structure also includes an enclosing structure or lid (22; 322) defining a closed space (40; 340) encompassing the source of heat (16*a*, 16*b*; 316*a*, 316*b*) and at least a surface (12*us*; 382*bs*) portion (12*usp*; 382*usp*) of the cold plate (12; 312) other than the portion to which the source of heat (16*a*, 16*b*; 316*a*, 316*b*) is affixed. A dielectric liquid (50; 350) substantially fills the closed space (40; 340), whereby it is in contact with both the source of heat (16*a*, 16*b*; 316*a*, 316*b*) and with that surface (12*us*; 382*bs*) portion (12*usp*; 382*usp*) of the cold plate (12; 312) other than the portion (382*ha*) to which the source of heat (16*a*, 16*b*; 316*a*, 316*b*) is affixed. The dielectric liquid (50; 350) has a boiling point slightly below or lower than the temperature of the spot maximum temperature (42*a*, 42*b*). The dielectric liquid (50; 350) contains diamond particles (70; 370), which may be in the form of diamond dust. In one embodiment of the invention, the dielectric liquid (50; 350) comprises a mixture of fluorocarbons, each having a different boiling point.

In one advantageous embodiment, the solid-state heat source (16*a*, 16*b*; 316*a*, 316*b*) comprises one or more semiconductor devices exposed to the dielectric liquid (50; 350), and the mixture of fluorocarbons is inert.

In another advantageous embodiment, the cold plate (12; 312) comprises at least one closed channel (36; 394*c*) extending there through for the flow of coolant fluid (399) other than the dielectric fluid (50; 350).

What is claimed is:

1. A structure, comprising:
   a cold plate;
   a source of heat affixed to a portion of said cold plate, for transferring at least some of said heat by direct thermal conduction from said source of heat to said cold plate, said source of heat having a temperature distribution defining at least one particular maximum spot temperature;
   an enclosing structure defining a closed space encompassing said source of heat and at least a portion of said cold plate other than said portion to which said source of heat is affixed; and
   a dielectric liquid substantially filling said closed space, said dielectric liquid containing diamond particles, and said dielectric liquid having a boiling point, which is slightly lower than said particular maximum spot temperature.

2. A structure according to claim 1, wherein said diamond particles are in the form of diamond dust.

3. A structure according to claim 1, wherein said portion of said cold plate to which said source of heat is affixed is generally planar, and said enclosing structure is a lid affixed to said cold plate in a region surrounding said source of heat.

4. A structure according to claim 1, wherein said dielectric liquid comprises a mixture of fluorocarbons having different boiling points.

5. A structure according to claim 4, wherein said source of heat comprises semiconductor devices exposed to said dielectric liquid, and said mixture of fluorocarbons is inert.

6. A structure, comprising:
   a cold plate;
   a source of heat affixed to a portion of said cold plate, for transferring at least some of said heat by direct thermal conduction from said source of heat to said cold plate, said source of heat having a temperature distribution defining at least one particular maximum spot temperature;
   an enclosing structure defining a closed space encompassing said source of heat and at least a portion of said cold plate other than said portion to which said source of heat is affixed; and
   a dielectric liquid substantially filling said closed space, said dielectric liquid containing diamond particles, and said dielectric liquid having a boiling point, which is slightly lower than said particular maximum spot temperature;
   wherein said cold plate comprises at least one closed channel extending there through for the flow of coolant fluid other than said dielectric fluid.

* * * * *